United States Patent [19]

Henze et al.

[11] 4,433,009

[45] Feb. 21, 1984

[54] METHOD OF MANUFACTURING PRINTED CIRCUITS

[75] Inventors: Helmut Henze; Ronald Capell, both of Berlin, Fed. Rep. of Germany

[73] Assignee: Schering Aktiengesellschaft, Berlin & Bergkamen, Fed. Rep. of Germany

[21] Appl. No.: 271,181

[22] Filed: Jun. 8, 1981

[30] Foreign Application Priority Data

Jun. 6, 1980 [DE] Fed. Rep. of Germany ....... 3021896

[51] Int. Cl.$^3$ .................. B05D 5/12; B05D 3/04; B44C 1/22; C03C 15/00
[52] U.S. Cl. ....................................... 427/97; 29/582; 156/645; 156/655; 156/659.1; 156/668; 156/902; 174/68.5; 427/307; 430/312; 430/315
[58] Field of Search ............... 156/633, 645, 655, 668, 156/659.1, 901, 902; 427/96–98, 307; 430/312, 315, 329; 29/582; 174/68.5

[56] References Cited

U.S. PATENT DOCUMENTS

| | | | |
|---|---|---|---|
| 4,268,614 | 5/1981 | Ueyama et al. | 430/315 |
| 4,283,243 | 8/1981 | Andreads et al. | 427/97 X |
| 4,285,991 | 8/1981 | Gedrat et al. | 427/97 |

*Primary Examiner*—William A. Powell
*Attorney, Agent, or Firm*—Michael J. Striker

[57] ABSTRACT

In accordance with the method of manufacturing printed circuits, a base material is provided with a plurality of holes in correspondence with the required conductors pattern, the base material with the holes is coated by a photopolymer layer, the photopolymer layer is selectively exposed and developed so as to release zones and boreholes for forming conductive paths, solder eyes and connecting contacts between both sides of the plate, then the layer of the current conductive material is applied in the regions of the thus released zones and boreholes so as to form the above-mentioned conductive paths, solder eyes and connecting contacts.

15 Claims, No Drawings

METHOD OF MANUFACTURING PRINTED CIRCUITS

BACKGROUND OF THE INVENTION

The present invention relates to a method of manufacturing printed circuits, particularly with fine conductive paths.

Methods of manufacturing of printed circuits are known in the art. Known methods possess some disadvantages which will be described hereinbelow. The so-called subtraction method possesses the disadvantage in the fact that the great quantity of the coating of the base material must be removed after the formation of the conductor pattern. At the same time the etching of the conductor train takes place with the accompanied deterioration which becomes more serious and extensive with the speed corresponding to the reduction of the width of the conductor paths. This phenomena prevent a further miniaturization within the frame of the subtraction method.

The so-called addition method has the disadvantage in the fact that the material can also deposit more or less on the insulating surfaces in undesirable manner. An additional disadvantage of this method is that the entire plate coated with an adhesive agent must be chemically treated. Because of this intensive moisture treatment, the adhesive agent has an electric insulating value which is considerably smaller than that of the epoxy resin, which also put the miniaturized printed circuits within narrow limits.

SUMMARY OF THE INVENTION

Accordingly, it is an object of the present invention to provide a method of manufacturing printed circuits which avoids the disadvantages of the prior art.

More particularly, it is an object of the present invention to provide a method manufacturing printed circuits which avoids undesirable metal depositing and simultaneously improves the insulating value.

In keeping with these objects and with others which will become apparent hereinafter, one feature of the present invention resides, briefly stated, in a method of manufacturing printed circuits which comprises the steps of providing a base material having two sides, forming a plurality of holes in the base material in correspondence with a required conductors pattern, so as to subsequently provide for metal contact between conductive trains supplied on both sides of a plate, coating the base material provided with the holes by a photopolymer layer, selectively exposing and developing the photpolymer layer on the base material so as to release zones and boreholes for forming conductive path, solder and connecting contacts between both sides of the plate, and applying a current conductive layer in the regions of the thus released zones and boreholes so as to form the conductive paths, solder eyes and connecting contacts.

In accordance with another advantageous feature of the present invention, the zones released by the exposing and developing of the photopolymer layer on the base material formed as an insulating material provided with the adhesive agent, are roughened. The roughening can be performed by dissolving the release zones by a solving agent and/or disintegrating the released zones by an aggressive agent, for example a chromium sulphuric acid etching agent.

Still another feature of the present invention resides in the fact that the step of coating of the base material with a photopolymer layer includes using a film and applying the polymer layer by direct suction of the latter. The step of selectively exposing and developing the photopolymer layer includes exposing the latter by a UV-lamp.

A further feature of the present invention is that the photopolymer layer may be foremd as a layer which is resistant to the above-mentioned solving or disintegrating agents.

Still a further feature of the present invention is that the photopolymer layer zones released by the exposing and developing are provided, after activation, with a first chemically deposited metal layer.

Still a further feature of the present invention is that the photopolymer resistant layer is removed after the first metallization by a solving agent, for example, by an organic solving agent or a water alkaline solution.

Finally, a current-free copper plating of the conductors pattern may be performed, without masking of a plate region determining an insulating surface.

When the method is performed in accordance with the present invention, the printed circuits are manufactured without an undesirable metal depositing. The method has also an extremely important technical advantage in the fact that the depositing of the fine conduit paths for the printed circuits can be performed with a width less than 100 microns, whereas the conventional methods produce wider conductive paths.

Another substantial advantage of the inventive method is that because of the covering of the insulated surfaces during the chemical treatment and activation, the insulating surfaces are not roughened and prevent contact with the treating and activating solutions. The insulation resistance is thereby by at least 10% higher than in the methods in which the entire adhesive base is treated.

Because of the selective treatment a deep laying of the conductive path pattern in the adhesive agent takes place in the region of the surfaces to be metal coated. Thereby, the metal coating is partially embedded so that an additional flank protection of the very fine conductive paths is provided.

DESCRIPTION OF A PREFERRED EMBODIMENT

A method of manufacturing printed circuits includes utilization of a base material such as glass fiber reinforced epoxy resin, phenol resin paper and epoxy resin paper, plexiglass and other materials coated with a suitable adhesive agent.

The base material is provided with a plurality of holes in correspondence with a required conductors pattern. The holes may be formed by drilling or punching processes. Then the base materials with the holes is coated with a UV-light sensitive photopolymer layer. For this purpose a film is dranw by a photoplotter, arranged in a holding device required for the adjustment above the plate provided with the holes, and applied onto the latter with the aid of vacuum directly without the utilization of a conventional vacuum foil. Thereupon the film is exposed by a UV-lamp.

After the exposure, developing is performed after keeping of a reaction time, for hardening of the exposed zones. The released adhesive agent layer is teated with a solvent and roughened with a chromium sulphuric acid etching agent. After the contamination, several rising steps and activation are performed. Finally, after reduction and acceleration, a striking metallization is carried out. the photopolymer layer is then removed by a special stripping process, for example with the utilization of an organic solving agent or a water-alkaline solution. Then, pickling and a chemical thick copper plating are performed. The rinse plate is tempered and subjected to subsequent treatment in desired manner.

The method in accordance with the present invention may involve the following materials. ABS polymers may be utilized as the adhesive agent. The photopolymer layer may be composed, for example of a photopolymerizable resist layer of ethylene non-saturated monomers and the like. Demethylformanide and/or chlorinated hydrocarbons may be used as the solving agent. Chromium sulphuric acid, potassium permanganate, sulphuric tri-oxide and ozone may be utilized as disintegrating agents. Metal activators such as palladium salt and chemical copper bath may be used as the activators.

The following example serves for illustration of the method in accordance with the present invention.

EXAMPLE

A conductive plate of glass fiber reinforced epoxy resin coated with adhesive agent based on nitrile caoutchouc or epoxy resin is drilled and chemically and/or mechanically released from drillings, degreased and dried. Then the plate is coated with a photopolymer in a known manner. For this purpose a plate is covered with a positive mask of the desired circuit pattern and thereafter is pressed with a negative pressure against the plate. Then the exposure by UV-light is performed, and after a certain reaction time is developed in trichlorethane. The thus released circuit patterned to be metal coated is swollen in a solvent and rinsed with water. Then the treatment is performed with chromium sulphuric acid of the composition of 200–300 ml of concentrated $H_2SO_4$/liter, 10–100 gram $CrO_3$/liter. Then the plate is rinsed with water and thereafter treated with a sulphur acidic ferrous sulfate solution. Then the plate is activated with a known-activator, for example, based on palladium.

The metallization is performed in a water chemical copper bath, for example of the following composition:
5–10 gram/liter $CuSO_4$ 5 $H_2O$
15–40 gram/liter calcium-natrium tartrate
5–10 gram/liter formaldehyde
5–15 gram/liter NaOH
pH-value 12.8.

The plate is then rinsed in water and dried. the photopolymer is removed from the plate by treatment with methylene chloride and subsequently pickled in a sulphur acid solution and rinsed with water. Then the copper body is formed on conductor trains, solder eyes and hole walls in a water chemical copper bath of for example the following composition:
5–15 grams/liter $CuSO_4$ 5 $H_2O$
25–40 gram/liter ethylene diamine tetraacetate
10–30 gram/liter NaOH
5–10 gram/liter formaldehyde with the addition of conventional stabilizers and wetting agents.

Thereby a conductive circuit is produced with high resolution less than 100 micron width and distance of the conductor trains with a layer thickness depending upon the requirements of the use. The adhesive strength exceeds 40 M/inch, and the insulation resistance is $1.10^{12} \Omega$.

It will be understood that each of the elements described above, or two or more together, may also find a useful application in other types of examples, differing from the types described above.

While the invention has been illustrated and described as embodied in a method of manufacturing printed circuits is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A method of manufacturing printed circuits, comprising the steps of successively providing a base material having two sides and provided with an adhesive agent; forming a plurality of holes in the base material, in correspondence with a required conductors pattern, so as to subsequently provide for metal contact between conductive trains applied on both sides of a plate; coating the base material provided with the holes, by a photopolymer layer; selectively exposing and developing the photopolymer layer on the base material so as to release zones and boreholes for forming conductive paths, solder eyes and connecting contacts between both sides of the plate; selectively roughening the adhesive agent on the base material in the thus released zones; and applying a current-conductive layer in the regions of the thus released and roughened zones and boreholes so as to form the conductive paths, solder eyes and connecting contacts.

2. A method as defined in claim 1, wherein said step of applying a current-conductive layer includes using a current-conductive layer of metal.

3. A method as defined in claim 1, wherein said step of coating with a photopolymer layer includes using a film and applying the polymer layer by direct suction of the latter.

4. A method as defined in claim 3, wherein said step of selectively exposing and developing the photopolymer layer includes exposing the latter with a UV-lamp.

5. A method as defined in claim 1, wherein said roughening step includes dissolving the zones of the base material with the adhesive agent, which zones have been released by the exposing and developing, said dissolving step includes dissolving by a solving agent.

6. A method as defined in claim 5, wherein said roughening step includes disintegrating the zones of the base material provided with the adhesive agent, which zones have been released by the exposing and developing, said disintegrating step includes disintegrating the same by an aggressive agent layer thereto.

7. A method as defined in claim 5, wherein said step of disintegrating by the aggressive agent includes using for the same a chromium sulphuric acid etching agent.

8. A method as defined in claim 5, wherein said step of coating the base material with a photopolymer layer to be exposed and developed includes using for the photopolymer layer a layer resistant to a respective one of said solving agent and disintegrating agent.

9. A method as defined in claim 6; and further comprising the step of activating the zones released by the exposing and developing of the photopolymer layer, after the roughening, said step of applying a current-conductive layer includes applying a first chemically deposited metal layer after the roughening and activating.

10. A method as defined in claim 9; and further comprising the step of removing the photopolymer layer after applying the first chemically deposited layer.

11. A method as defined in claim 10, wherein said step of removing the photopolymer layer includes removing the same by a solving agent.

12. A method as defined in claim 11, wherein said step of removing the photopolymer layer includes removing the same by an organic solvent.

13. A method as defined in claim 11, wherein said step of removing the photopolymer layer includes removing the same by a water alkaline solution.

14. A method as defined in claim 1; and further comprising the step of current-free copperplating of the conductors, selectively without masking of a plate region determining an insulating surface.

15. A method of manufacturing printed circuits, comprising the steps of successively providing a base insulating material having two sides and provided with an adhesive agent; forming a plurality of holes in the base material, in correspondence with a required conductors pattern, so as to subsequently provide for metal contact between conductive trains applied on both sides of a plate; coating the base material provided with the holes, by a photopolymer layer; selectively exposing and developing the photopolymer layer on the base material so as to release zones and boreholes for forming conductive paths, solder eyes and connecting contacts between both sides of the plate; selectively roughening the adhesive agent in the thus released zones and boreholes by dissolving the zone of the insulating material with the adhesive agent by a solving agent and/or by disintegrating the zones of the insulating material provided with the adhesive agent by an aggressive agent; activating the zones released by the exposing and developing of the photopolymer layer after the roughening; and applying a first chemically deposited metal layer after the roughening and activating and then a current-conductive layer in the regions of the thus released and roughened zones and boreholes so as to form the conductive paths, solder eyes and connecting contacts.

* * * * *